United States Patent
Higashi et al.

(10) Patent No.: US 8,513,091 B2
(45) Date of Patent: Aug. 20, 2013

(54) METHOD FOR WAFER BONDING USING GOLD AND INDIUM

(75) Inventors: Robert Higashi, Morristown, NJ (US); Karen M. Newstrom-Peitso, Morristown, NJ (US); Jeff A. Ridley, Morristown, NJ (US)

(73) Assignee: Honeywell International Inc., Morristown, NJ (US)

( * ) Notice: Subject to any disclaimer, the term of this patent is extended or adjusted under 35 U.S.C. 154(b) by 194 days.

(21) Appl. No.: 12/940,773

(22) Filed: Nov. 5, 2010

(65) Prior Publication Data

US 2012/0112348 A1 May 10, 2012

(51) Int. Cl.
*H01L 21/30* (2006.01)

(52) U.S. Cl.
USPC .................................. 438/455; 257/E23.162

(58) Field of Classification Search
USPC .................. 257/E21.122, E21.519, E21.567, 257/753, E23.162, 686; 438/118, 406, 455, 438/109, 107
See application file for complete search history.

(56) References Cited

U.S. PATENT DOCUMENTS

| 2005/0058168 A1* | 3/2005 | Hu et al. ......................... 372/44 |
| 2006/0092614 A1* | 5/2006 | Partridge et al. ............... 361/767 |
| 2007/0048898 A1* | 3/2007 | Carlson et al. ................ 438/106 |

OTHER PUBLICATIONS

Bernstein, "Semiconductor Joining by the Solid-Liquid-Interdiffusion (SLID) Process", Journal of Electrochemical Society, Dec. 1966, vol. 113, No. 12, pp. 1282-1288.

* cited by examiner

*Primary Examiner* — Bilkis Jahan
(74) *Attorney, Agent, or Firm* — Brooks, Cameron & Huebsch, PLLC

(57) ABSTRACT

Devices, methods, and systems for wafer bonding are described herein. One or more embodiments include forming a bond between a first wafer and a second wafer using a first material adjacent the first wafer and a second material adjacent the second wafer. The first material includes a layer of gold (Au) and a layer of indium (In), and the second material includes a layer of Au. Forming the bond between the first wafer and the second wafer includes combining the layer of Au in the first material, the layer of In in the first material, and a portion of the layer of Au in the second material, wherein an additional portion of the layer of Au in the second material is not combined with the layer of Au in the first material and the layer of In in the first material.

5 Claims, 4 Drawing Sheets

METHOD FOR WAFER BONDING USING GOLD AND INDIUM

GOVERNMENT RIGHTS

The subject matter of this disclosure was made with government support under Contract No.: HR0011-09-C-0049 awarded by the SRI International (Prime)/DARPA. Accordingly, the U.S. Government has certain rights to subject matter disclosed herein.

TECHNICAL FIELD

The present disclosure relates to devices, methods, and systems for wafer bonding.

BACKGROUND

Semiconductor device fabrication can include the bonding of two (or more) semiconductor wafers. For example, wafer bonding can be utilized in the fabrication, e.g., formation, process of infrared (IR) detectors and fluidic devices, among other types of semiconductor devices.

Semiconductor wafers can be bonded using, for example, a solder bonding process. A solder bonding process can include melting a filler metal, such as, for example, indium or a lead-indium alloy, between the wafers, and using the melted filler metal to bond, e.g., join, the wafers.

Such a soldered wafer bond, however, may not be able to withstand (e.g., may fail at) temperatures of approximately 200 degrees Celsius or greater. Further, a soldered wafer bond may include voids, and accordingly may not provide a hermetic, e.g., airtight, seal.

Semiconductor wafers can also be bonded using a solid-liquid interdiffusion (SLID) bonding process. A SLID bonding process can include forming high-temperature phases by diffusion in the presence of a liquid.

A SLID wafer bond may be able to withstand higher temperatures than a soldered wafer bond. However, a SLID wafer bond may include voids, and accordingly may not provide a hermetic seal.

DETAILED DESCRIPTION

Figure 1:
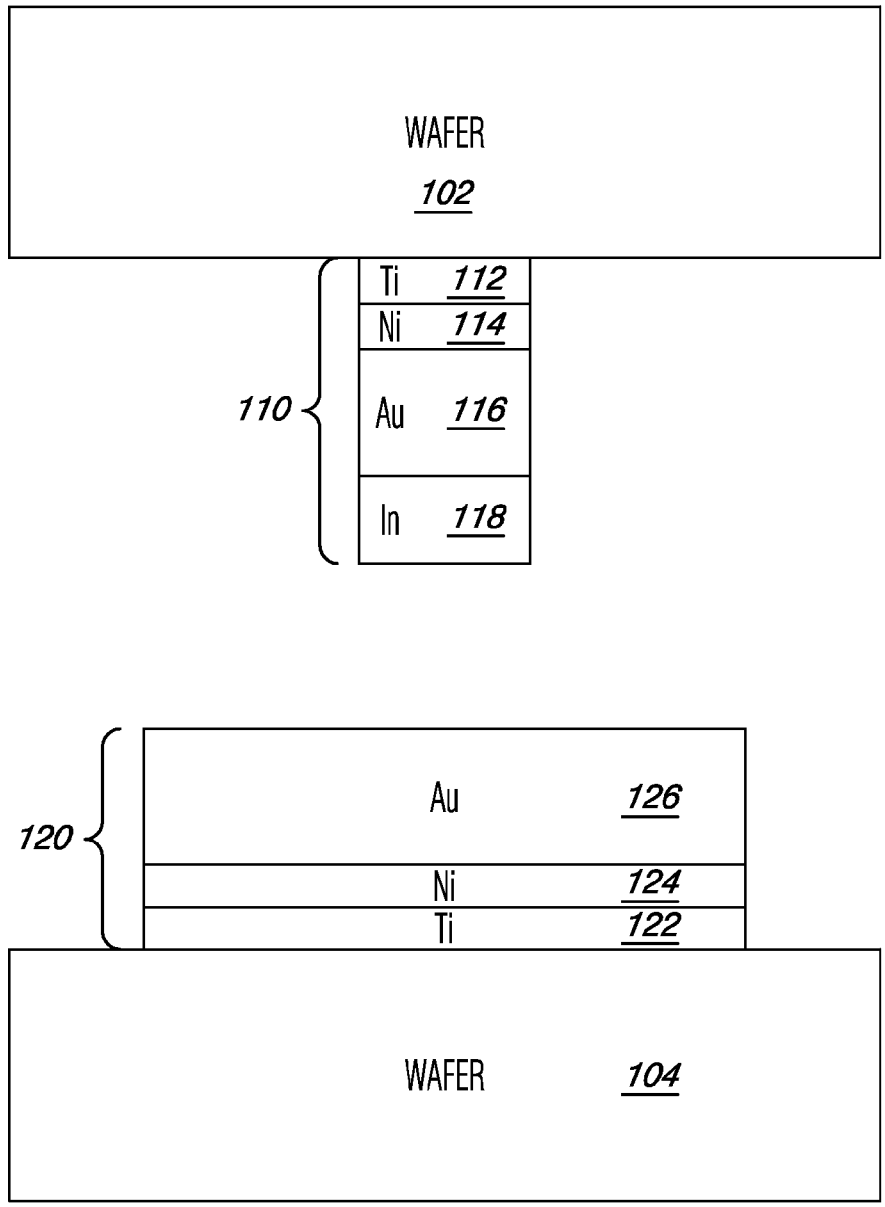
FIG. 1 illustrates a system for wafer bonding in a pre-bond configuration in accordance with one or more embodiments of the present disclosure.

Devices, methods, and systems for wafer bonding are described herein. One or more embodiments include forming a bond between a first wafer and a second wafer using a first material adjacent the first wafer and a second material adjacent the second wafer. The first material includes a layer of gold (Au) and a layer of indium (In), and the second material includes a layer of Au. Forming the bond between the first wafer and the second wafer includes combining the layer of Au in the first material, the layer of In in the first material, and a portion of the layer of Au in the second material, wherein an additional portion of the layer of Au in the second material is not combined with the layer of Au in the first material and the layer of In in the first material.

Wafer bonds in accordance with one or more embodiments of the present disclosure may withstand (e.g., may not fail at) temperatures of approximately 400 degrees Celsius or greater. Additionally, wafer bonds in accordance with one or more embodiments of the present disclosure may not include voids, and accordingly may provide a hermetic, e.g., airtight, seal.

In the following detailed description, reference is made to the accompanying drawings that form a part hereof. The drawings show by way of illustration how one or more embodiments of the disclosure may be practiced. These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present invention, and should not be taken in a limiting sense.

As used herein, "a" or "a number of" something can refer to one or more such things. For example, "a number of wafers" can refer to one or more wafers.

FIG. 1 illustrates a system 100 for wafer bonding in accordance with one or more embodiments of the present disclosure. In the embodiment illustrated in FIG. 1, system 100 is in a pre-bond configuration. That is, the embodiment illustrated in FIG. 1 illustrates system 100 before wafer bonding has occurred.

As shown in FIG. 1, system 100 includes a first semiconductor wafer 102 and a second semiconductor wafer 104 opposite first semiconductor wafer 102. First semiconductor wafer 102 can be, for example, a topcap semiconductor wafer (e.g., a silicon wafer having flow channels etched therein), and second semiconductor wafer 104 can be, for example, a heater semiconductor wafer (e.g., a wafer having thin film heaters thereon). However, embodiments of the present disclosure are not limited to particular types of wafers. In the embodiment illustrated in FIG. 1, a bond has not yet been formed between first wafer 102 and second wafer 104.

As shown in FIG. 1, system 100 includes a first adhesion material 110 adjacent first wafer 102 (e.g., adjacent a surface of first wafer 102) and a second adhesion material 120 adjacent second wafer 104 (e.g., adjacent a surface of second wafer 104) and opposite first adhesion material 110. In the embodiment illustrated in FIG. 1 (e.g., the pre-bond configuration), first adhesion material 110 is separate from (e.g., not in contact with) second adhesion material 120. First adhesion material 110 and second adhesion material 120 can be used to form a bond between first wafer 102 and second wafer 104, as will be further described herein.

First adhesion material 110 can have a width (e.g., the distance from one side of first adhesion material 110 to the other side of adhesion material 110) of approximately 30 micrometers (μm). Second adhesion material 120 can have a width of approximately 140 μm.

As illustrated in FIG. 1, first adhesion material 110 includes a layer of titanium (Ti) 112 adjacent first wafer 102 (e.g., adjacent a surface of first wafer 102), a layer of nickel (Ni) 114 adjacent Ti layer 112, a layer of gold (Au) 116 adjacent Ni layer 114, and a layer of indium (In) 118 adjacent Au layer 116. In some embodiments, Ti layer 112 can have a thickness (e.g., the distance from the top of Ti layer 112 to the bottom of Ti layer 112) of approximately 0.02 μm, Ni layer 114 can have a thickness of approximately 0.2 μm, Au layer 116 can have a thickness of approximately 2.0 μm, and In layer 118 can have a thickness of approximately 1.7 μm.

As illustrated in FIG. 1, second adhesion material 120 includes a layer of Ti 122 adjacent second wafer 104 (e.g., adjacent a surface of second wafer 104), a layer of Ni 124 adjacent Ti layer 122, and a layer of Au 126 adjacent Ni layer 124. In some embodiments, Ti layer 122 can have a thickness of approximately 0.02 μm, Ni layer 124 can have a thickness of approximately 0.2 μm, and Au layer 126 can have a thickness of approximately 2.0 μm.

Figure 2A:
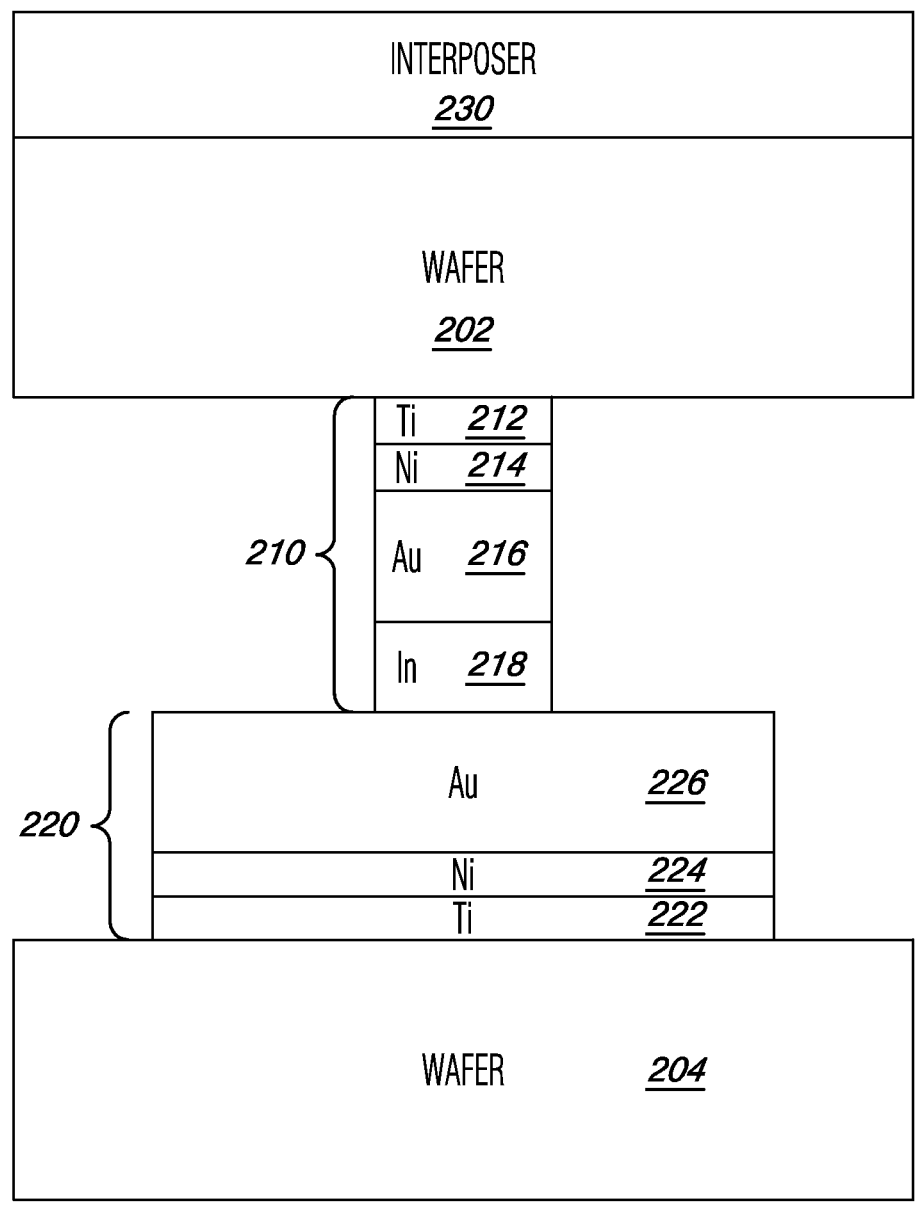
FIG. 2A illustrates a system for wafer bonding in a bonding configuration in accordance with one or more embodiments of the present disclosure.

FIG. 2A illustrates a system 200 for wafer bonding in accordance with one or more embodiments of the present disclosure. In the embodiment illustrated in FIG. 2A, system 200 is in a bonding configuration. That is, the embodiment illustrated in FIG. 2A illustrates system 200 while wafer bonding is occurring, e.g., at the beginning of the bonding process.

As shown in FIG. 2A, system 200 includes a first semiconductor wafer 202 and a second semiconductor wafer 204 opposite first semiconductor wafer 202. First wafer 202 and second wafer 204 can be analogous to first wafer 102 and second wafer 104, respectively, previously described in connection with FIG. 1, except that in the embodiment illustrated in FIG. 2, a bond is being formed between first wafer 202 and second wafer 204.

As shown in FIG. 2A, system 200 includes a first adhesion material 210 adjacent first wafer 202 (e.g., adjacent a surface of first wafer 202) and a second adhesion material 220 adjacent second wafer 204 (e.g., adjacent a surface of second wafer 204). First adhesion material 210 and second adhesion material 220 can be analogous to first adhesion material 110 and second adhesion material 120, respectively, previously described in connection with FIG. 1, except that first adhesion material 210 is adjacent (e.g., in contact with) second adhesion material 220 (e.g., a surface of first adhesion material 210 is adjacent a surface of second adhesion material 220), as shown in FIG. 2A.

First adhesion material 210 and second adhesion material 220 can be used to form a bond between first wafer 202 and second wafer 204. For example, first adhesion material 210 can be moved adjacent second adhesion material 220 (e.g., first adhesion material 210 and second adhesion material 220 can be moved toward each other), as illustrated in FIG. 2A. First adhesion material 210 can be moved adjacent second adhesion material 220 by applying a force and/or pressure to first wafer 202 and/or second wafer 204, as will be further described herein.

As illustrated in FIG. 2A, first adhesion material 210 includes a layer of titanium (Ti) 212 adjacent first wafer 202 (e.g., adjacent a surface of first wafer 202), a layer of nickel (Ni) 214 adjacent Ti layer 212, a layer of gold (Au) 216 adjacent Ni layer 214, and a layer of indium (In) 218 adjacent Au layer 216. Ti layer 212, Ni layer 214, Au layer 216, and In layer 218 can be analogous to Ti layer 112, Ni layer 114, Au layer 116, and Ni layer 118, respectively, previously described in connection with FIG. 1.

As illustrated in FIG. 2A, second adhesion material 220 includes a layer of Ti 222 adjacent second wafer 204 (e.g., adjacent a surface of second wafer 204), a layer of Ni 224 adjacent Ti layer 222, and a layer of Au 226 adjacent Ni layer 224. Ti layer 222, Ni layer 224, and Au layer 226 can be analogous to Ti layer 122, Ni layer 124, and Au layer 126, respectively, previously described in connection with FIG. 1, except that Au layer 226 is adjacent (e.g., in contact with) In layer 218 (e.g., a surface of Au layer 226 is adjacent a surface of In layer 218), as illustrated in FIG. 2A.

Ti layers 212 and 222, Ni layers 214 and 224, Au layers 216 and 226, and/or In layer 218 can be used to form a bond between first wafer 202 and second wafer 204. For example, Au layer 226 can be moved adjacent In layer 218 (e.g., Au layer 226 and In layer 218 can be moved toward each other), as illustrated in FIG. 2A. Au layer 226 can be moved adjacent In layer 218 by applying a force and/or pressure to first wafer 202 and/or second wafer 204, as will be further described herein.

As shown in FIG. 2A, system 200 includes a flexible interposer material 230. In the embodiment illustrated in FIG. 2A, flexible interposer material 230 is adjacent first wafer 202, e.g., adjacent the surface of first wafer 202 that is opposite the surface of first wafer 202 to which first adhesion material 210 is adjacent. However, flexible interposer material 230 can also be located adjacent second wafer 204, e.g., adjacent the surface of second wafer 204 that is opposite the surface of second wafer 204 to which second adhesion material 220 is adjacent.

Flexible interposer material 230 can be, for example, a woven graphite material, such as Grafoil. However, embodiments of the present disclosure are not limited to a particular type of interposer.

Flexible interposer material 230 can be used to form a bond between first wafer 202 and second wafer 204. For example, flexible interposer material 230 can be used to apply a force and/or pressure to first wafer 202, as will be further described herein, e.g., in connection with FIG. 2B. Applying the force and/or pressure to first wafer 202 can move first adhesion material 210 adjacent second adhesion material 220 (e.g., In layer 218 adjacent Au layer 226), as illustrated in FIG. 2A.

Figure 2B:
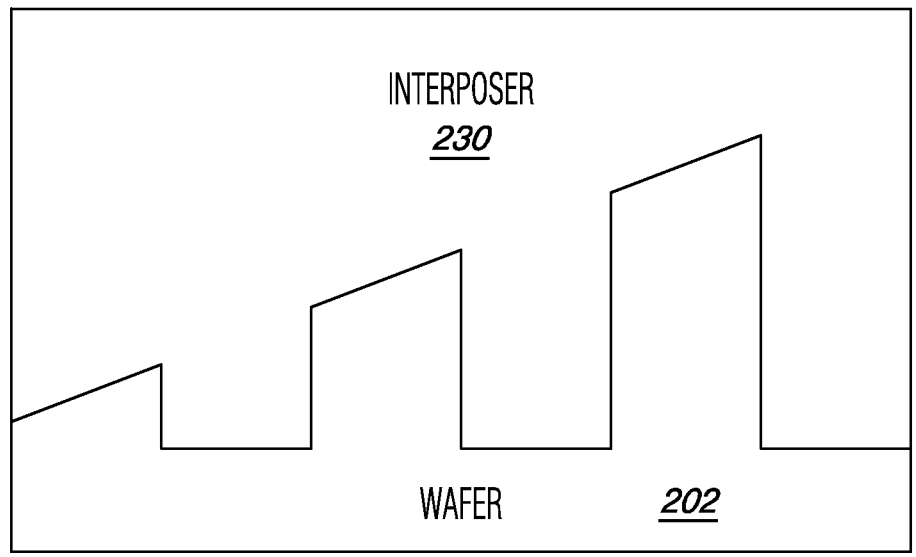
FIG. 2B is a close-up view of a portion of the system illustrated in FIG. 2A.

FIG. 2B is a close-up view of a portion of system 200 illustrated in FIG. 2A. Specifically, FIG. 2B is a close-up view of a portion of first wafer 202 and flexible interposer material 230.

As shown in FIG. 2B, the surface of first wafer 202 to which flexible interposer material 230 is adjacent (e.g., the surface of first wafer 202 that is opposite the surface of first wafer 202 to which first adhesion material 210 is adjacent) can be a non-planar, e.g., non-level, surface. For example, the surface of first wafer 202 to which flexible interposer material 230 is adjacent can include recesses of varying depths, as illustrated in FIG. 213.

Because interposer 230 is a flexible material, however, when a force and/or pressure is applied to flexible interposer material 230, flexible interposer material 230 can contact substantially all of the non-planar surface of first wafer 202, as illustrated in FIG. 2B. For example, flexible interposer material 230 can substantially fill the recesses in the non-planar surface of first wafer 202, as illustrated in FIG. 2B.

Because flexible interposer material 230 can contact substantially all of the non-planar surface of first wafer 202, when force and/or pressure is applied to flexible interposer material 230, flexible interposer material 230 can distribute a more uniform or approximately uniform force and/or pressure across the non-planar surface of first wafer 202, in some instances. That is, when force and/or pressure is applied to flexible interposer material 230, flexible interposer material 230 can apply a substantially uniform force and/or pressure to substantially all of the non-planar surface of first wafer 202.

Figure 3:
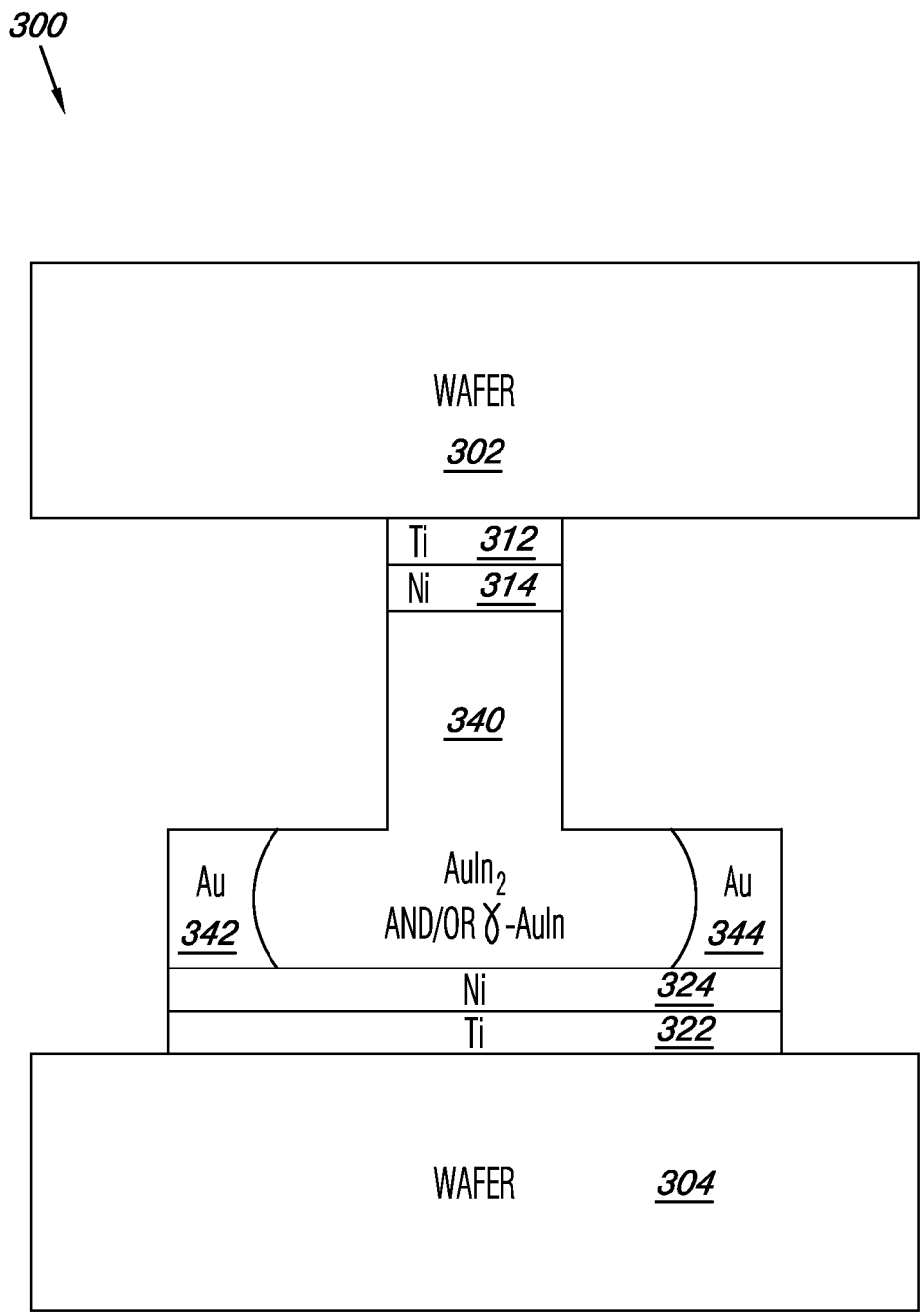
FIG. 3 illustrates a system for wafer bonding in a post-bond configuration in accordance with one or more embodiments of the present disclosure.

FIG. 3 illustrates a system 300 for wafer bonding in accordance with one or more embodiments of the present disclosure. In the embodiment illustrated in FIG. 3, system 300 is in a post-bond configuration. That is, the embodiment illustrated in FIG. 3 illustrates system 300 after wafer bonding has occurred.

As shown in FIG. 3, system 300 includes a first semiconductor wafer 302 and a second semiconductor wafer 304 opposite first semiconductor wafer 302. First wafer 302 and second wafer 304 can be analogous to first wafers 102 and 202 and second wafers 104 and 204, respectively, previously described in connection with FIGS. 1 and 2, except that a bond has been formed between first wafer 302 and second wafer 304, as will be further described herein.

As illustrated in FIG. 3, system 300 includes a layer of titanium (Ti) 312 adjacent first wafer 302 (e.g., adjacent a surface of first wafer 302) and a layer of nickel (Ni) 314 adjacent Ti layer 312. That is, the bond formed between first wafer 302 and second wafer 304 can include Ti layer 312 and Ni layer 314. Ti layer 312 and Ni layer 314 can be analogous to Ti layers 112 and 212 and Ni layers 114 and 214, respectively, previously described in connection with FIGS. 1 and 2.

As illustrated in FIG. 3, system 300 includes a layer of Ti 322 adjacent second wafer 304 (e.g., adjacent a surface of second wafer 304) and a layer of Ni 324 adjacent Ti layer 322. That is, the bond formed between first wafer 302 and second wafer 304 can include Ti layer 322 and Ni layer 324. Ti layer 322 and Ni layer 324 can be analogous to Ti layers 122 and 222 and Ni layers 124 and 224, respectively, previously described in connection with FIGS. 1 and 2.

As illustrated in FIG. 3, system 300 includes a layer 340 adjacent Ni layer 314 and Ni layer 324 (e.g., adjacent a surface of Ni layer 314 and a portion of a surface of Ni layer 324). That is, the bond formed between first wafer 302 and second wafer 304 can include layer 340. Layer 340 can be formed while bonding first wafer 302 and second wafer 304, as will be further described herein.

As illustrated in FIG. 3, layer 340 can include $AuIn_2$ and/or gamma phase Au—In (γ-AuIn). In some embodiments, the $AuIn_2$ can be approximately 53% In by weight and approximately 47% Au by weight, and/or the γ-AuIn can be approximately 14% to 20% In by weight, and approximately 80% to 86% Au by weight.

As illustrated in FIG. 3, system 300 includes Au layer 342 adjacent layer 340 and Ni layer 324 (e.g., adjacent a surface of layer 340 and a portion of the surface of Ni layer 324 that is not adjacent layer 340). System 300 also includes Au layer 344 adjacent layer 340 and Ni layer 324 (e.g., adjacent a surface of layer 340 that is opposite the surface to which Au layer 342 is adjacent, and a portion of the surface of Ni layer 324 that is not adjacent layer 340). That is, the bond formed between first wafer 302 and second wafer 304 can include Au layer 342 and Au layer 344.

Layer 340 (e.g., the bond between first wafer 302 and second wafer 304) can be formed by combining at least a portion of Au layer 216, all of In layer 218, and at least a portion of Au layer 226 previously described in connection with FIG. 2. That is, layer 340 can be formed by reacting all of In layer 218 in at least a portion of Au layer 216 and at least a portion of Au layer 226.

However, because Ti layer 212, Ni layer 214, Au layer 216, In layer 218, Ti layer 222, Ni layer 224, and/or Au layer 226 have the thicknesses previously described herein, a portion of Au layer 216 and/or a portion of Au layer 226 may not combine with In layer 218. That is, a portion of Au layer 216 and/or a portion of Au layer 226 may not react with In layer 218. The portions of Au layer 216 and/or Au layer 226 that do not react and/or combine with In layer 218 can correspond to Au layer 342 and Au layer 344 illustrated in FIG. 3.

Because a portion of Au layer 216 and/or a portion of Au layer 226 may not react and/or combine with In layer 218 (e.g., because the bond formed between first wafer 302 and second wafer 304 includes Au layer 342 and Au layer 344), the bond formed between first wafer 302 and second wafer 304 may withstand (e.g., may not fail at) temperatures of approximately 400 degrees Celsius or greater in some embodiments. Additionally, because the bond formed between first wafer 302 and second wafer 304 includes Au layer 342 and Au layer 344, the bond formed between first wafer 302 and second wafer 304 may not include voids, and accordingly may provide a hermetic, e.g., airtight, seal in some embodiments.

Further, because the bond between first wafer 302 and second wafer 304 can be formed using a flexible interposer material (as previously described herein), the bond may withstand temperatures of approximately 400 degrees Celsius or greater in some embodiments. Additionally, because the bond between first wafer 302 and second wafer 304 can be formed using a flexible interposer material (as previously described herein), the bond may not include voids, and accordingly, may provide a hermetic seal in some embodiments.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:
1. A method for wafer bonding, comprising:
forming a bond between a first wafer and a second wafer using a first material adjacent the first wafer and a second material adjacent the second wafer, wherein:
the first material includes a layer of gold (Au) and a layer of indium (In);

the second material includes a layer of Au; and forming the bond between the first wafer and the second wafer includes combining the layer of Au in the first material, the layer of In in the first material, and a portion of the layer of Au in the second material, wherein:

combining the layer of Au in the first material, the layer of In in the first material, and the portion of the layer of Au in the second material includes forming gamma phase Au-In; and an additional portion of the layer of Au in the second material is not combined with the layer of Au in the first material and the layer of In in the first material.

2. The method of claim 1, wherein the bond formed between the first wafer and the second wafer does not include voids.

3. The method of claim 1, wherein:

the layer of Au in the first material has a thickness of approximately 2.0 micrometers ($\mu m$);

the layer of In in the first material has a thickness of approximately 1.7 $\mu m$; and the layer of Au in the second material has a thickness of approximately 2.0 $\mu m$.

4. The method of claim 1, wherein the method includes forming the bond between the first wafer and the second wafer using a flexible interposer material adjacent the first wafer or the second wafer.

5. The method of claim 1, wherein combining the layer of Au in the first material, the layer of In in the first material, and the portion of the layer of Au in the second material includes forming $AuIn_2$.

* * * * *